(12) United States Patent
Chen et al.

(10) Patent No.: US 12,089,349 B2
(45) Date of Patent: *Sep. 10, 2024

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Ming-Hung Chen, Kaohsiung (TW); Yung I Yeh, Kaohsiung (TW); Chang-Lin Yeh, Kaohsiung (TW); Sheng-Yu Chen, Kaohsiung (TW)

(73) Assignee: ADVANCED SEMICONDUCTOR ENGINEERING, INC., Koahsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/239,723

(22) Filed: Aug. 29, 2023

(65) Prior Publication Data

US 2023/0413454 A1  Dec. 21, 2023

Related U.S. Application Data

(63) Continuation of application No. 17/573,595, filed on Jan. 11, 2022, now Pat. No. 11,744,024, which is a
(Continued)

(51) Int. Cl.
*H01L 23/00* (2006.01)
*H05K 1/14* (2006.01)
(Continued)

(52) U.S. Cl.
CPC ........... *H05K 5/0017* (2013.01); *H05K 1/142* (2013.01); *H05K 1/144* (2013.01); *H05K 1/181* (2013.01);
(Continued)

(58) Field of Classification Search
CPC .................. H05K 3/284; H05K 5/065; H05K 2201/10037; H05K 2201/10128;
(Continued)

(56) References Cited

U.S. PATENT DOCUMENTS 8,525,340 B2 * 9/2013 Eckhardt ................. H01L 24/24
438/49
2003/0197272 A1  10/2003 Suzuki
(Continued)

OTHER PUBLICATIONS

Final Office Action for U.S. Appl. No. 16/563,713, issued Jun. 24, 2021, 11 pages.
(Continued)

*Primary Examiner* — Sherman Ng
(74) *Attorney, Agent, or Firm* — FOLEY & LARDNER LLP

(57) ABSTRACT

A semiconductor device package includes a display device, an encapsulation layer disposed in direct contact with the display device, and a reinforced structure surrounded by the encapsulation layer. The reinforced structure is spaced apart from a surface of the display device. A method of manufacturing a semiconductor device package is also disclosed.

15 Claims, 21 Drawing Sheets

Related U.S. Application Data continuation of application No. 16/563,713, filed on Sep. 6, 2019, now Pat. No. 11,224,132.

(51) Int. Cl.
*H05K 1/18* (2006.01)
*H05K 3/28* (2006.01)
*H05K 5/00* (2006.01)
*H05K 5/06* (2006.01)
*H05K 9/00* (2006.01)

(52) U.S. Cl.
CPC ............ *H05K 3/284* (2013.01); *H05K 5/065* (2013.01); *H05K 9/0022* (2013.01); *H05K 2201/041* (2013.01); *H05K 2201/10037* (2013.01); *H05K 2201/10128* (2013.01); *H05K 2201/10151* (2013.01); *H05K 2203/1316* (2013.01); *H05K 2203/1327* (2013.01)

(58) Field of Classification Search
CPC ............ H05K 2201/10151; H05K 2203/1316; H01L 23/562
See application file for complete search history.

(56) References Cited

U.S. PATENT DOCUMENTS

| | | |
|---|---|---|
| 2008/0308305 A1 | 12/2008 | Kawabe |
| 2009/0095518 A1* | 4/2009 | Matsushita ....... H01L 23/49811 29/829 |
| 2009/0107703 A1 | 4/2009 | Abe et al. |
| 2010/0314637 A1 | 12/2010 | Kim et al. |
| 2013/0334643 A1 | 12/2013 | Igarashi |
| 2015/0138699 A1 | 5/2015 | Yamazaki |
| 2015/0338879 A1 | 11/2015 | Hiramoto et al. |
| 2016/0366762 A1* | 12/2016 | Lin ...................... H05K 3/4694 |
| 2017/0117200 A1* | 4/2017 | Kim ...................... H01L 24/97 |
| 2019/0232438 A1 | 8/2019 | Hino et al. |
| 2020/0168557 A1 | 5/2020 | Tsai |

OTHER PUBLICATIONS

Non-Final Office Action for U.S. Appl. No. 16/563,713, issued Jan. 22, 2021, 12 pages.
Notice of Allowance for U.S. Appl. No. 16/563,713, issued, Sep. 7, 2021, 9 pages.
Notice of Allowance for U.S. Appl. No. 17/573,595, issued Apr. 12, 20223, 16 pages.

* cited by examiner

SEMICONDUCTOR DEVICE PACKAGE AND METHOD OF MANUFACTURING THE SAME

CROSS-REFERENCE TO RELATED APPLICATIONS

This application is a continuation of U.S. patent application Ser. No. 17/573,595, filed Jan. 11, 2022, now U.S. Pat. No. 11,744,024, which is a continuation of U.S. patent application Ser. No. 16/563,713 filed Sep. 6, 2019, now U.S. Pat. No. 11,224,132 the contents of which are incorporated herein by reference in their entireties.

BACKGROUND

1. Technical Field

The present disclosure generally relates to a semiconductor device package and a method of manufacturing the same, and to a semiconductor device package including reinforced structure(s), and a method of manufacturing the same.

2. Description of the Related Art

A watch generally has a band attached to a housing which accommodates some electronic components. Extra function(s) may be specified for integration into the watch (geographic information collection or determination, biological information collection or determination, and so forth), which means more components (such as Global Positioning System (GPS) module, heart rate sensing module, and so forth) should be introduced into the housing. As a result, size and weight of the housing may inevitably increase, which may adversely affect user's experience.

SUMMARY

In one or more embodiments, a semiconductor device package includes a display device, an encapsulation layer disposed in direct contact with the display device, and a reinforced structure surrounded by the encapsulation layer. The reinforced structure is spaced apart from a surface of the display device.

In one or more embodiments, a semiconductor device package includes an electronic component, a reinforced structure disposed on the electronic component, and an encapsulation layer encapsulating the electronic component and the reinforced structure.

In one or more embodiments, a method of manufacturing a semiconductor package includes providing an electronic component and providing a reinforced structure on the electronic component. The method further includes disposing an encapsulation layer to encapsulate the electronic component and the reinforced structure.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
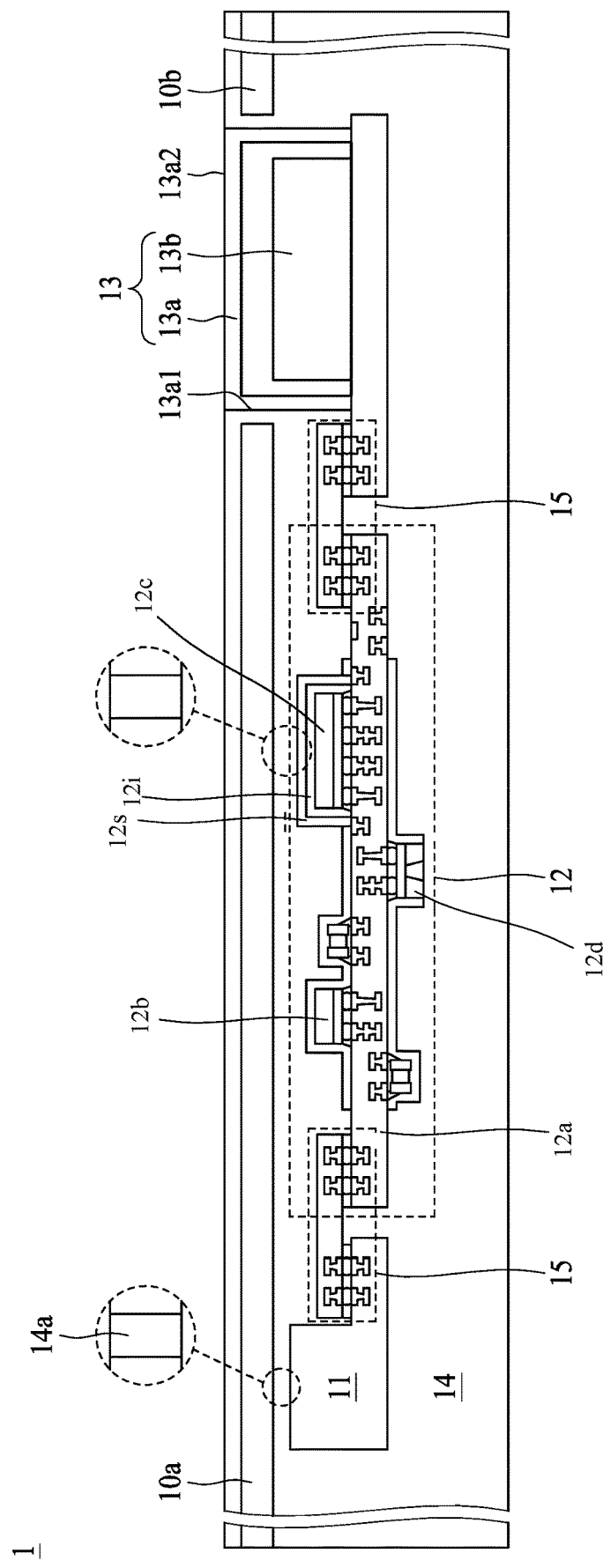
FIG. 1A illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross-sectional view of a semiconductor device package 1 in accordance with some embodiments of the present disclosure. The semiconductor device package 1 includes reinforced structures 10a and 10b, a power device 11, an electronic component 12, a display device 13, an encapsulation layer 14, and connectors 15.

The encapsulation layer 14 encapsulates the power device 11. The encapsulation layer 14 encapsulates the electronic component 12. The encapsulation layer 14 encapsulates the display device 13. The power device 11 is embedded in the encapsulation layer 14. The electronic component 12 is embedded in the encapsulation layer 14. The display device 13 is embedded in the encapsulation layer 14.

The encapsulation layer 14 can have a Young's modulus ranged from about 1 megapascal (MPa) to about 100 MPa. The encapsulation layer 14 can include a thermoplastic material. The encapsulation layer 14 can include a molding compound. The encapsulation layer 14 can include resin. The encapsulation layer 14 can include soft or flexible material(s). The encapsulation layer 14 can include thermoplastic polyurethane (TPU), silicone, or the like. The encapsulation layer 14 can include homogeneous material. The encapsulation layer 14 can be devoid of fillers. The encapsulation layer 14 can be devoid of particles.

The reinforced structures 10a and 10b can be embedded in the encapsulation layer 14. The reinforced structure 10a can be vertically or elevationally overlapped with the power device 11. The reinforced structure 10a can cover the power device 11. The reinforced structure 10a is vertically or elevationally overlapped with the electronic component 12. The reinforced structure 10a can cover the electronic component 12.

Figure 1B:
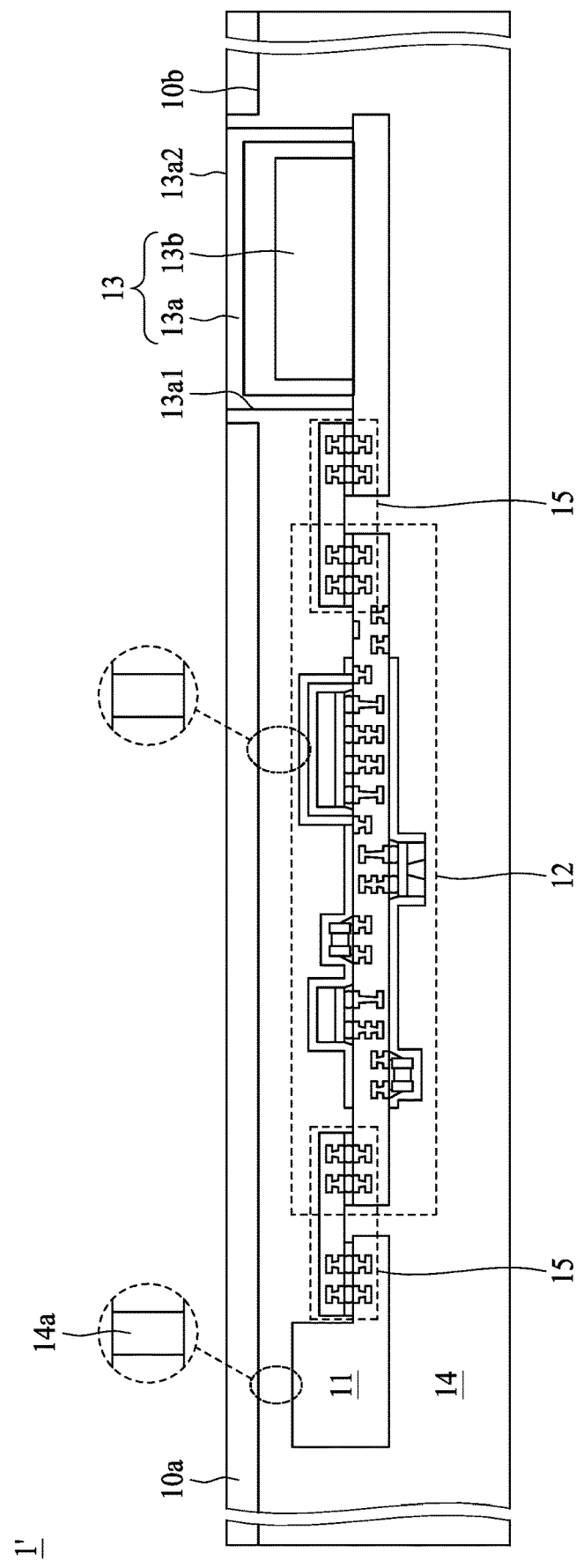
FIG. 1B illustrates a cross-sectional view of a semiconductor device package in accordance with some embodiments of the present disclosure.
Figure 1C:
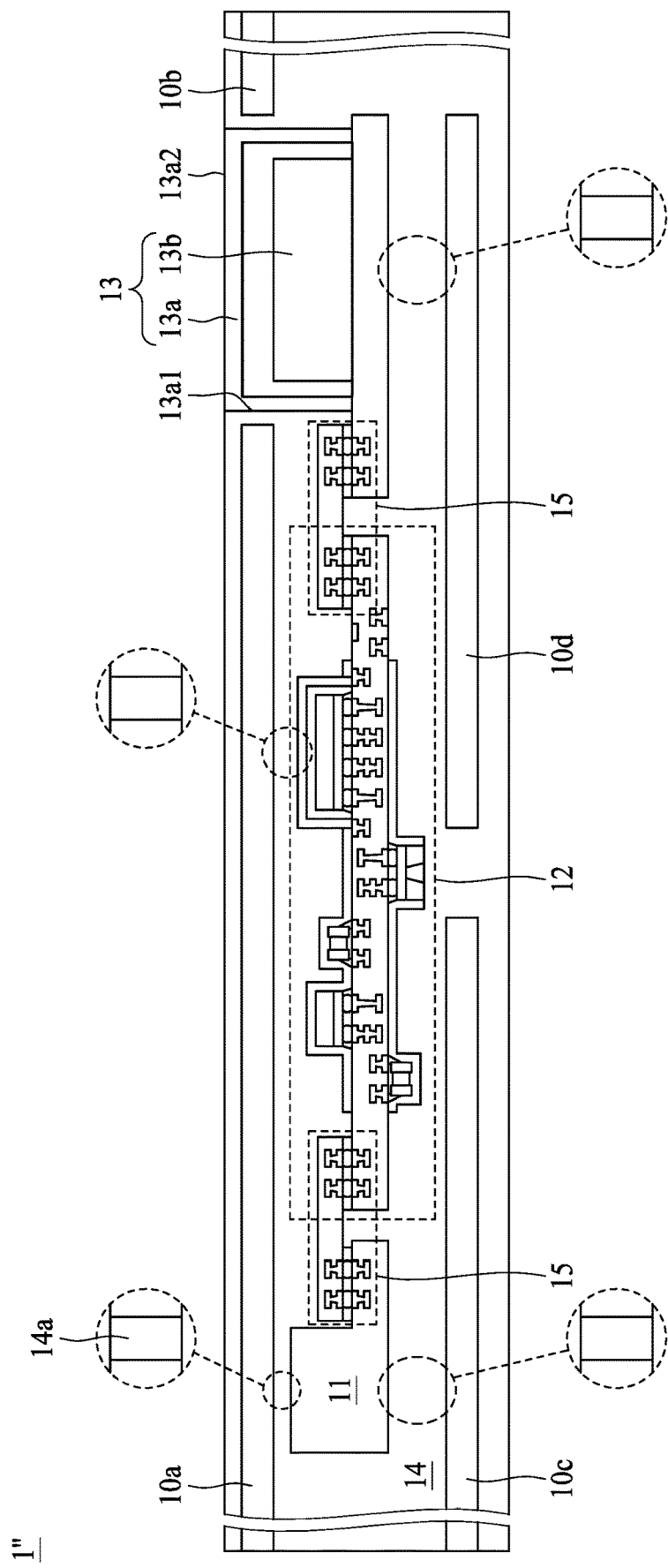
FIG. 1C illustrates a cross-sectional view of a semiconductor device package in accordance with some embodiments of the present disclosure.
Figure 1D:
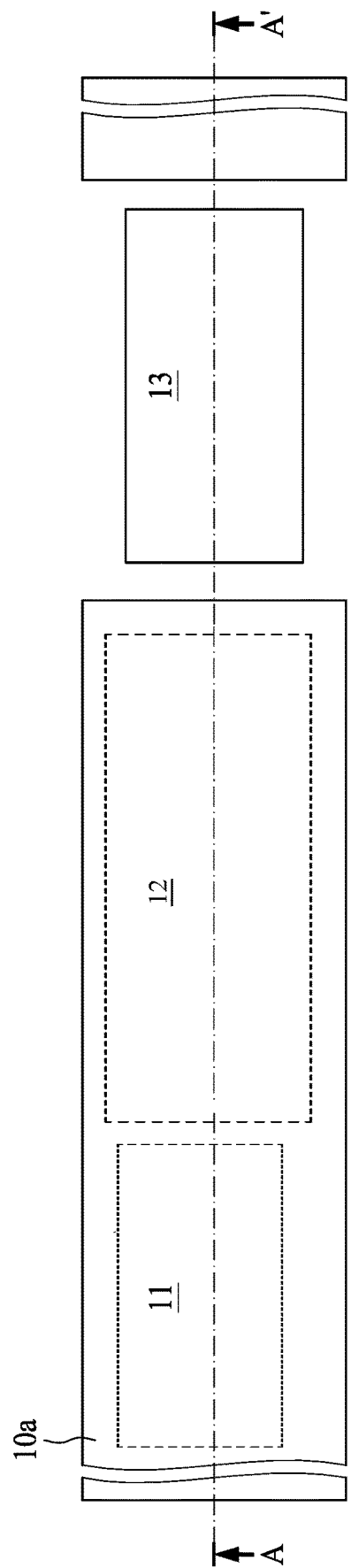
FIG. 1D illustrates a top view of a semiconductor device package in accordance with some embodiments of the present disclosure.

Referring to FIG. 1D, which illustrates a top view of a semiconductor device package (or a top view of the semiconductor device package 1, 1', or 1") in accordance with some embodiments of the present disclosure.

Referring to FIG. 1D, a projection of the power device 11 may fall on the reinforced structure 10a. A projection of the power device 11 may fall within the reinforced structure 10a. The entire projection of the power device 11 can be covered by the reinforced structure 10a. The area of an upper surface (not denoted in FIG. 1D) of the power device 11 can be less than the area of a lower surface (not denoted in FIG. 1D) the reinforced structure 10a. A width of the power device 11 can be less than or substantially the same as the reinforced structure 10a.

A projection of the electronic component 12 may fall on the reinforced structure 10a. A projection of the electronic component 12 may fall within the reinforced structure 10a. The entire projection of the electronic component 12 can be covered by the reinforced structure 10a. The area of an upper surface (not denoted in FIG. 1D) of the electronic component 12 can be less than the area of a lower surface (not denoted in FIG. 1D) the reinforced structure 10a. A width of the electronic component 12 can be less than or substantially the same as the reinforced structure 10a.

Figure 1E:
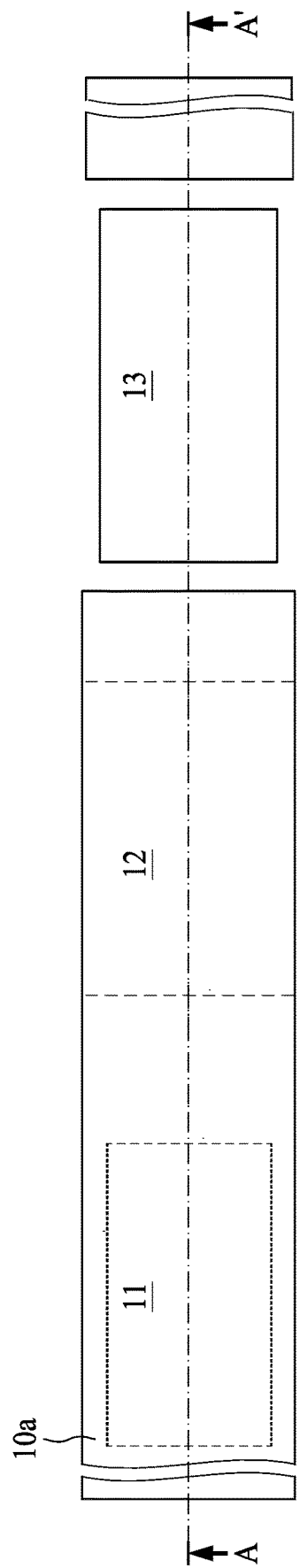
FIG. 1E illustrates a top view of a semiconductor device package in accordance with some embodiments of the present disclosure.

Referring to FIG. 1E, which illustrates a top view of a semiconductor device package (or a top view of the semiconductor device package 1, 1', or 1"). A width of the electronic component 12 can be substantially the same as that of the reinforced structure 10a.

The display device 13 may not be covered by the reinforced structure 10a. The display device 13 can be exposed from the reinforced structure 10a. The display device 13 can be spaced apart from the reinforced structure 10a.

Referring back to FIG. 1A, the reinforced structures 10a and 10b may have a Young's modulus different from that of the encapsulation layer 14. For examples, the reinforced structures 10a and 10b may have a Young's modulus greater than that of the encapsulation layer 14. The encapsulation layer 14 may have a Young's modulus less than that of the reinforced structures 10a and 10b. The reinforced structures 10a and may have a Young's modulus ranged from about 1 gigapascal (GPa) to about 100 GPa. The reinforced structures 10a and 10b can have same or similar material(s). The reinforced structures 10a and 10b can have different material(s). The reinforced structures 10a and 10b can have metal mesh or grid. The reinforced structures 10a and can have material(s) which can resist relatively more stress, impact, warpage, bend, twist or other physical or structural change. The reinforced structures 10a and 10b may include copper (Cu), nickel (Ni), stainless steel (SUS), polymethyl methacrylate (PMMA), Polystyene (PS), Acrylonitrile Butadiene Styrene (ABS), an epoxy-based material, or a combination of two or more thereof.

In the semiconductor device package 1, the power device 11, the electronic component 12, and/or the display device 13 can be distributed in the encapsulation layer 14, but not integrated in a housing. In other words, the housing is not required in the embodiments as shown in FIG. 1A. Elimination of the housing can help to reduce size of the semiconductor device package 1. Elimination of the housing can help to reduce weight of the semiconductor device package 1. Elimination of the housing can help to miniaturization of the semiconductor device package 1. In the semiconductor device package 1, electronic components can be distributed in the band. In the semiconductor device package 1, all the electronic components can be distributed in the band, which means relatively more components can be integrated in the semiconductor device package 1.

The power device 11 may include a battery pack(s) or batteries. In some embodiments, the power device 11 may include a band battery, a stripe battery, a lithium polymer battery, aluminum laminated battery, or other foldable batteries.

The electronic component 12 may have various electronic devices such as, for examples, a sensor element, a microprocessor, a memory, and other suitable electronic devices. In some embodiments, as shown in FIG. 1A, the electronic component 12 includes a substrate 12a, electronic devices 12b and 12c (such as a power device, a radio frequency (RF)

device, the like), a sensor 12d (such as a microelectromechanical systems (MEMS) sensor), an insulator 12i, and a shielding layer 12s.

The substrate 12a may include, for example, a printed circuit board, such as a paper-based copper foil laminate, a composite copper foil laminate, or a polymer-impregnated glass-fiber-based copper foil laminate. The substrate 12a may include an interconnection structure, such as a redistribution layer (RDL) or a grounding element.

The electronic devices 12b and 12c and the sensor 12d are disposed on the substrate 12a. The shielding layer 12s is disposed over the electronic device 12c. In some embodiments, the shielding layer 12s can be used to provide electromagnetic interference (EMI) protection for the electronic devices in the electronic component 12. In some embodiments, the insulator 12i is conformally disposed on the substrate 12a to cover the electronic devices 12b and 12c. The insulator 12i is between the shielding layer 12s and the electronic device 12c. The insulator 12i insulates the electronic device 12c from the shielding layer 12s. The insulator 12i can be used as a stress buffer. The numbers, the positions, and the configurations of the electronic devices in the electronic component 12 can be set depending on design specifications.

The display device 13 may be disposed at the substantially same elevation as the electronic component 12. For examples, the display device 13 and the electronic component 12 are disposed at the substantially same level. For examples, the display device 13 and the electronic component 12 are distributed in the band (such as the encapsulation layer 14) side by side. For examples, the display device 13 and the electronic component 12 are disposed laterally with respect to each other in the encapsulation layer 14.

The display device 13 includes a barrier 13a and a light-emitting device 13b within the barrier 13a. The display device 13 may include a screen, a display comprised of a series of pixels, a graphical user interface and the like. In some embodiments, the display device 13 may be a liquid-crystal display (LCD), a light-emitting diode (LED) display, an organic light-emitting diode (OLED) display (such as an OLED glass display, an OLED plastic display, the like), or a combination thereof.

The barrier 13a of the display device 13 has surfaces 13a1 and 13a2. In some embodiments, the surfaces 13a2 may be a portion of a polarizer, a cap, or the combination thereof. The surfaces 13a2 of the barrier 13a is exposed from the encapsulation layer 14. The barrier 13a of the display device 13 is spaced apart from the reinforced structures 10a and 10b. For examples, the surfaces 13a1 of the barrier 13a is spaced apart from the reinforced structure 10a. The encapsulation layer 14 surrounds the barrier 13a of the display device 13. The encapsulation layer 14 is in direct contact with the barrier 13a of the display device 13. The encapsulation layer 14 is interposed between the barrier 13a of the display device 13 and the reinforced structures 10a and 10b.

The power device 11, the electronic component 12 and the display device 13 are electrically connected through the connectors 15. In some embodiments, the connectors 15 may be or may include, for example, a printed circuit board, a solder ball, a conducting resin, a conducting paste, or a combination thereof.

In some embodiments, the encapsulation layer 14 may include a spacer 14a as shown in the dotted circles in FIG. 1A. The spacer 14a is disposed between the reinforced structures (such as the reinforced structures 10a and 10b) and the other components (such as the power device 11 and the electronic component 12) in the encapsulation layer 14.

For examples, as shown in FIG. 1A, the power device 11 is spaced apart from the reinforced structure 10a by the spacer 14a. The electronic component 12 is spaced apart from the reinforced structure 10a by the spacer 14a. In some embodiments, the spacer 14a may be used as a stress buffer. In some embodiments, the spacers 14a may be used to locate the reinforced structures 10a and 10b and provide a substantially planar surface for disposing the reinforced structures 10a and 10b. For examples, the spacer 14a on the power device 11 may be lower than the spacer 14a on the electronic component 12. In some embodiments, the spacer 14a may have a material different from that of the encapsulation layer 14. In some embodiments, the spacer 14a may have the same material with the encapsulation layer 14 to provide a better bonding force therebetween. In some embodiments, there may be a glue (or other material for attaching the spacer 14a) besides to the spacer 14a.

FIG. 1B illustrates a cross-sectional view of a semiconductor device package 1' in accordance with some embodiments of the present disclosure. The semiconductor device package 1' in FIG. 1B is similar to the semiconductor device package 1 in FIG. 1A, and the differences therebetween are described below.

The reinforced structures 10a and 10b in the semiconductor device package 1' in FIG. 1B is exposed from the encapsulation layer 14. Therefore, the reinforced structures 10a and 10b are visible from the appearance. In some embodiments, the material of the encapsulation layer 14 may be selected to be transparent or partially transparent, so as to see the reinforced structures 10a and 10b from the appearance. In some embodiments, the surface of the reinforced structures 10a and 10b that exposed from the encapsulation layer 14 is substantially coplanar with the surface 13a2 of the barrier 13a of the display device 13.

FIG. 1C illustrates a cross-sectional view of a semiconductor device package 1" in accordance with some embodiments of the present disclosure. The semiconductor device package 1" in FIG. 1C is similar to the semiconductor device package 1 in FIG. 1A, and the differences therebetween are described below.

The semiconductor device package 1" in FIG. 1C further includes reinforced structures 10c and 10d. The reinforced structures 10c and 10d are disposed opposite to the reinforced structures 10a and 10b. The reinforced structures 10a, 10b, 10c, and 10d protect the power device 11, the electronic component 12, and the display device 13 from two sides. In some embodiments, spacers (such as those shown in the dotted circles in FIG. 1C) are disposed between the reinforced structures (such as the reinforced structures 10c and 10d) and the other components (such as the power device 11 and the display device 13) in the encapsulation layer 14. In some embodiments, one or more electronic devices (such as the sensor) of the electronic component 12 is exposed from the reinforced structures 10c and 10d. For examples, a projection of the sensor of the electronic component 12 may not fall on the reinforced structures 10c and 10d. In some embodiments, the reinforced structures 10c and 10d may cover the whole projection of the electronic component 12 except for that of the sensor. The numbers, the positions, and the configurations of the reinforced structures in the semiconductor device package can be set depending on design specifications.

Figure 1F:
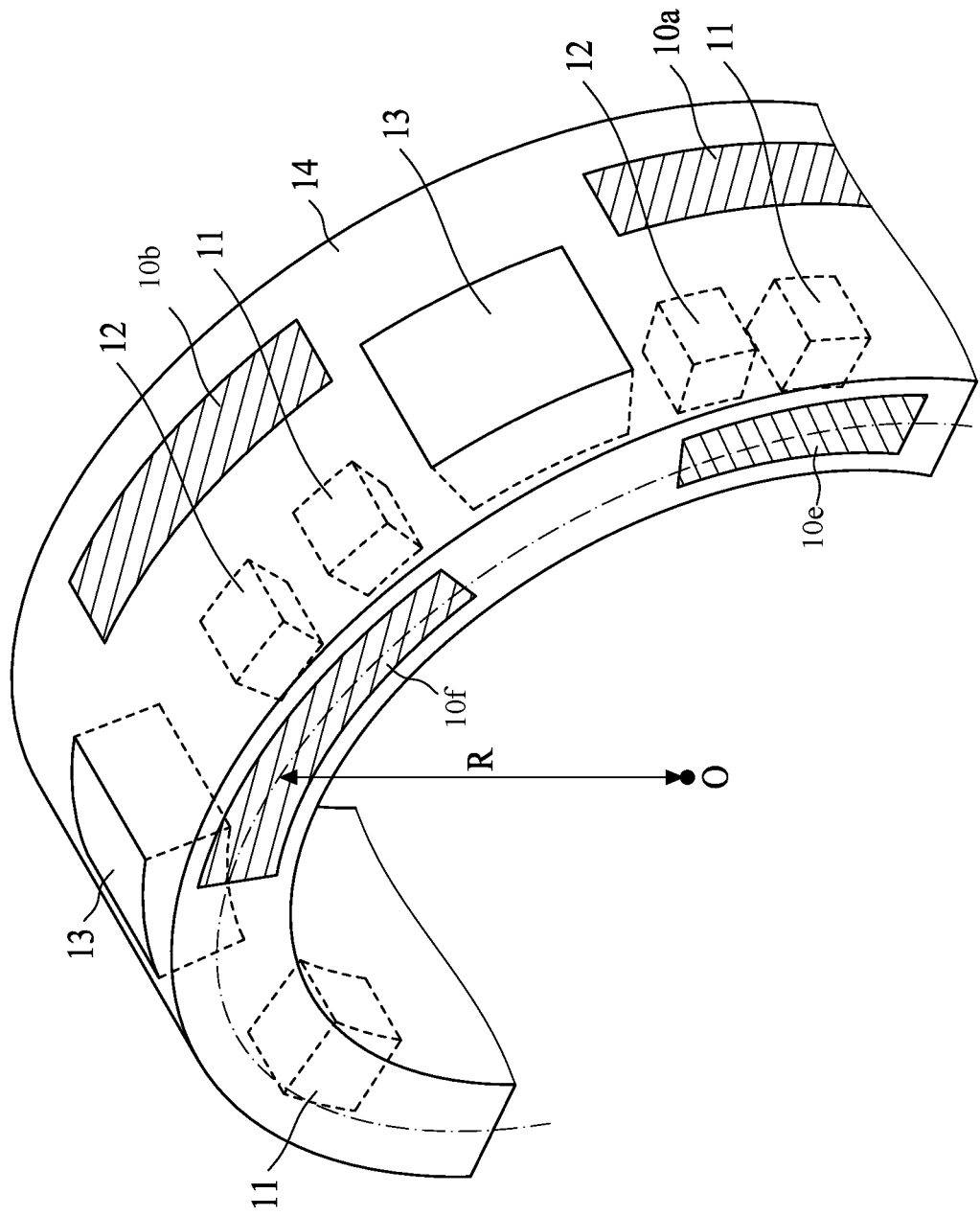
FIG. 1F illustrates a perspective view of a semiconductor device package in accordance with some embodiments of the present disclosure.

FIG. 1F illustrates a perspective view of a semiconductor device package (or a perspective view of the semiconductor device package 1, 1', or 1") in accordance with some embodiments of the present disclosure. The semiconductor device package in FIG. 1F is similar to the semiconductor device package 1 in FIG. 1A, and the differences therebetween are described below.

The semiconductor device package in FIG. 1F further includes reinforced structures 10e and 10f. The reinforced structures 10a and 10b are disposed vertically or elevationally with respect to the power device 11 and the electronic component 12. The reinforced structures 10e and 10f are disposed laterally with respect to the power device 11 and the electronic component 12. The semiconductor device package in FIG. 1F includes more than one of each of the power device 11, the electronic component 12, and the display device 13. In some embodiments, the power devices 11, the electronic components 12, and the display devices 13 are substantially disposed at the same elevation in the encapsulation layer 14. The power devices 11, the electronic components 12, and the display devices 13 are distributed in the encapsulation layer 14, but not integrated in a housing.

The semiconductor device package in FIG. 1F can have a radius of curvature (denoted as "R" in FIG. 1F) less than 20 millimeter (mm). The semiconductor device package in FIG. 1F can have a radius of curvature R in a range from about 2 mm to about 20 mm.

Figure 1G:
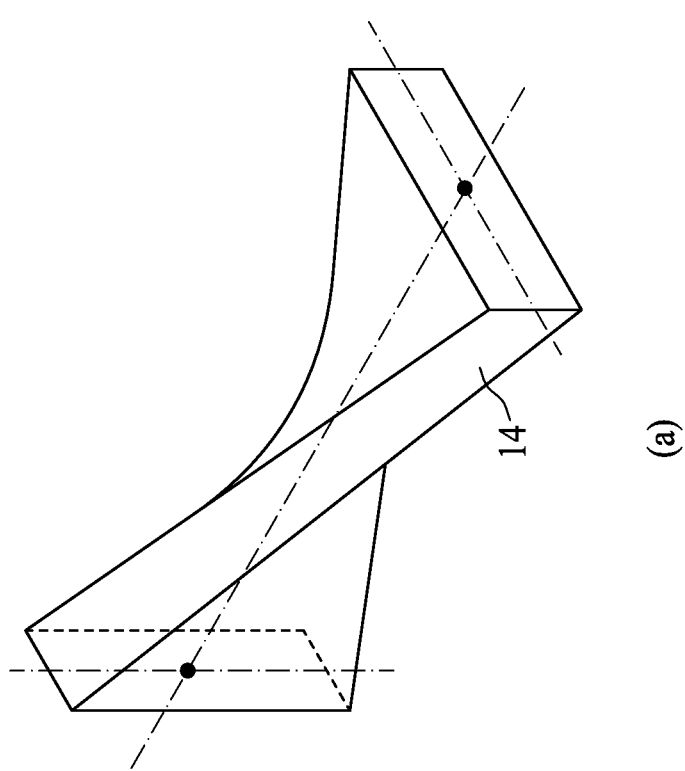
FIG. 1G illustrates a perspective view of a semiconductor device package in accordance with some embodiments of the present disclosure.
Figure 1G:
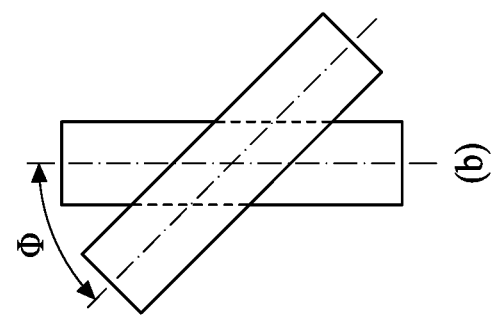

FIG. 1G illustrates a perspective view of a semiconductor device package (or a perspective view of the semiconductor device package 1, 1', or 1") in accordance with some embodiments of the present disclosure. The components in the semiconductor device package are not denoted in FIG. 1G except for the encapsulation layer 14 for conciseness. The semiconductor device package in FIG. 1G can have a twisting angle (denoted as "Φ" in FIG. 1G) in a range from about 30° to about 60°, from about 40° to about 50°, or about 45°.

Figure 1H:
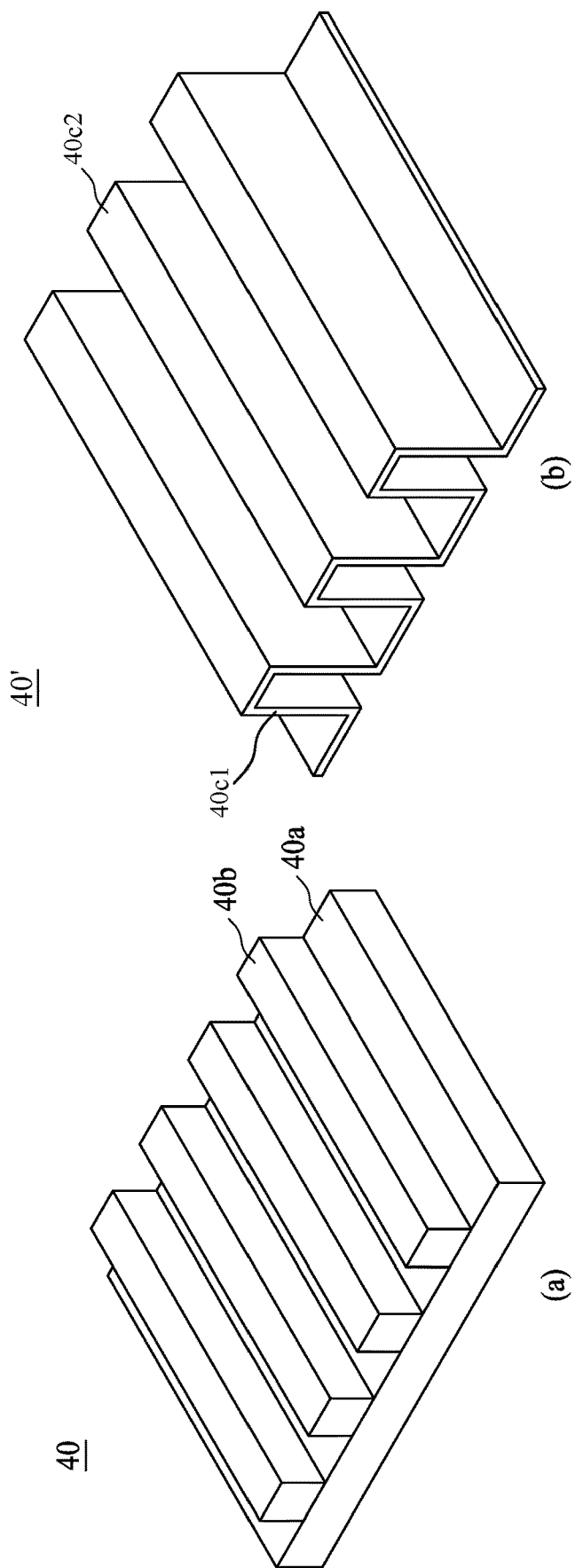
FIG. 1H illustrates a perspective view of a reinforced structure in accordance with some embodiments of the present disclosure.

FIG. 1H, which includes (a) and (b), illustrates a perspective view of each of two reinforced structures in accordance with some other embodiments of the present disclosure.

Referring to (a) of FIG. 1H, the reinforced structure 40 has a base portion and some posts or walls 40b disposed on the base portion 40a. Each of the posts or walls 40b can be spaced apart from one other. The post or walls 40b can have a side across one side of the base portion 40a. The reinforced structure 40 can have a comb or comb-like structure.

Referring to (b) of FIG. 1H, the reinforced structure 40' has a plate or layer having some bends. The plate or layer has a portion 40c1 and a portion 40c2. The portion 40c1 can form a right angle with respect to the portion 40c2. In some other embodiments, the bending angle of the plate or layer 40c can be varied due to design change. For example, the portion 40c1 can form an acute angle or an obtuse angle with respect to the portion 40c2. In some other embodiments, the portion 40c1 and the portion 40c2 can form a round or curve bend (or connection). For examples, the plate or layer can have a wave or wave-like structure in some other embodiments. The design of (b) of FIG. 1H may consume relatively less material, which can help to reduce weight.

The reinforced structure 40 or 40' illustrated in FIG. 1H can help to mitigate impact on the semiconductor device package. For examples, the portion 40c2 of the plate or layer 40' can help to mitigate impact. The reinforced structure 40 or 40' can be anti-twist. The reinforced structure 40 or 40' can be anti-bend. The reinforced structure 40 or 40' can resist bending force. The reinforced structure 40 or 40' can resist twisting force. For example, the base portion 40a can improve anti-twist capability of the semiconductor device package.

Figure 1I:
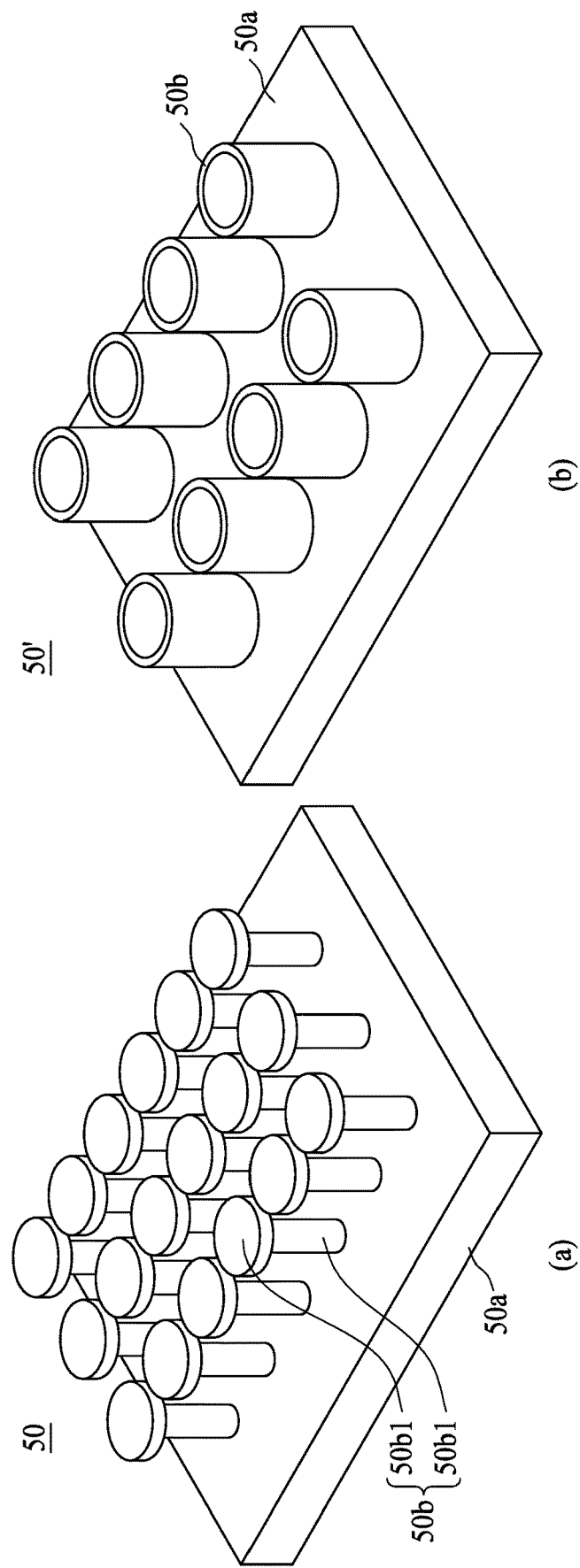
FIG. 1I illustrates a perspective view of a reinforced structure in accordance with some embodiments of the present disclosure.

FIG. 1I, which includes (a) and (b), illustrates a perspective view of each of two reinforced structures in accordance with some other embodiments of the present disclosure.

Referring to (a) of FIG. 1I, the reinforced structure 50 has a base portion 50a and some posts 50b protruding or extending from the base portion 50a. The post 50b can have an upper portion 50b1 and a lower portion 50b2. The upper portion 50b1 can have a width relatively greater than the lower portion 50b2. The reinforced structure 50 can have a mushroom or mushroom like structure.

Referring to (b) of FIG. 1I, the reinforced structure 50' has a base portion and some posts 50b protruding or extending from the base portion 50a. The posts of the reinforced structure 50' can have a ring or ring-like shape (or profile). The post 50b of the reinforced structure 50' can include hollow tube or hollow column.

The reinforced structure 50 or 50' illustrated in FIG. 1I can help to mitigate impact on the semiconductor device package. For examples, the post 50b can help to mitigate impact. The reinforced structure 50 or 50' can be anti-twist. The reinforced structure 50 or 50' can be anti-bend. The reinforced structure 50 or 50' can resist bending force. The reinforced structure 50 or 50' can resist twisting force. For example, the base portion 50a can improve anti-twist capability of the semiconductor device package.

Figure 1J:
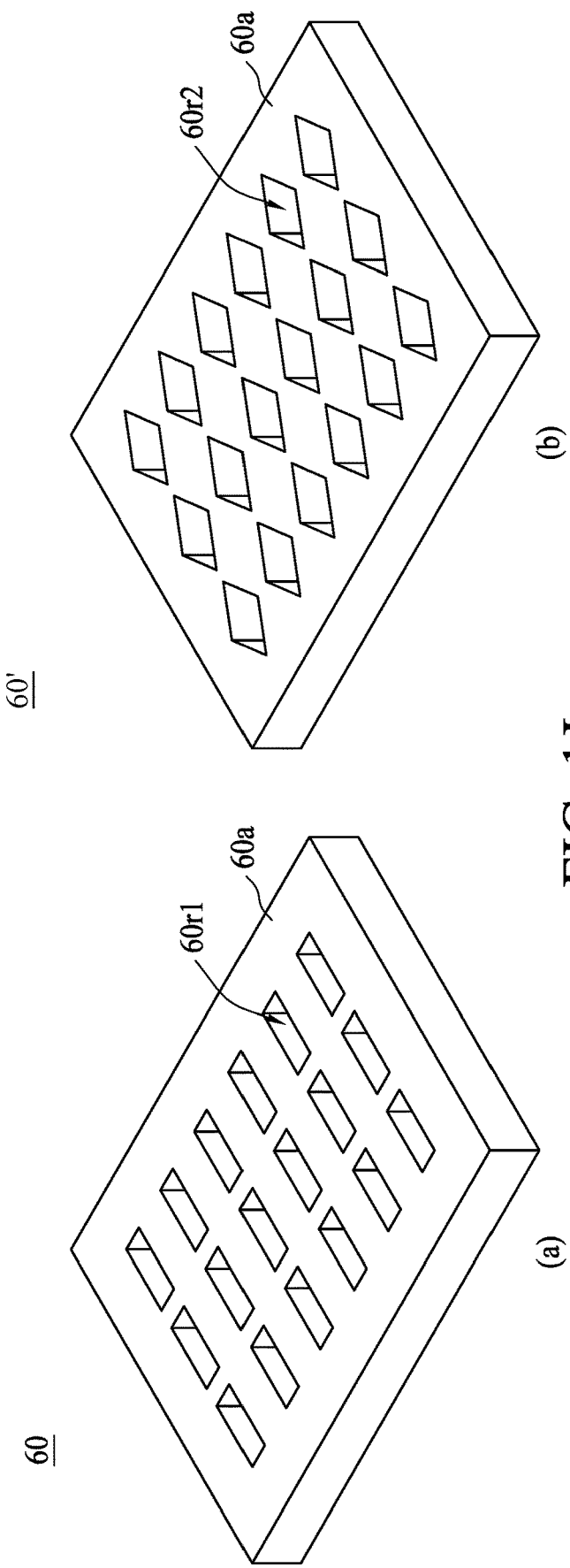
FIG. 1J illustrates a perspective view of a reinforced structure in accordance with some embodiments of the present disclosure.

FIG. 1J, which includes (a) and (b), illustrates a perspective view of each of two reinforced structures in accordance with some other embodiments of the present disclosure.

Referring to (a) of FIG. 1J, the reinforced structure 60 has a base portion 60a having some openings or recesses 60r1. The reinforced structure 60 can include a mesh or grid structure. Size of the opening or recess 60r1 can be varied due to design change.

Referring to (a) of FIG. 1J, the reinforced structure 60' has a base portion 60a having some openings or recesses 60r2. The opening or recess 60r2 can have a diamond or diamond-like shape (profile). The adjacent sidewalls of the opening or recess 60r2 are not perpendicular to each other, which can help to distribute the stress applied on the side of the base portion 60a. Size of the opening or recess 60r2 can be varied due to design change.

The reinforced structure 40, 50, 50' and 60 as discussed above can include flexible material having relatively great Young's modulus, for example, metal or other suitable material(s).

The reinforced structure 10a, 10b, 10c, 10d, 10e, and 10f discussed above can be replaced by one or more of the reinforced structure 40, 50, 50' and 60.

Figure 2:
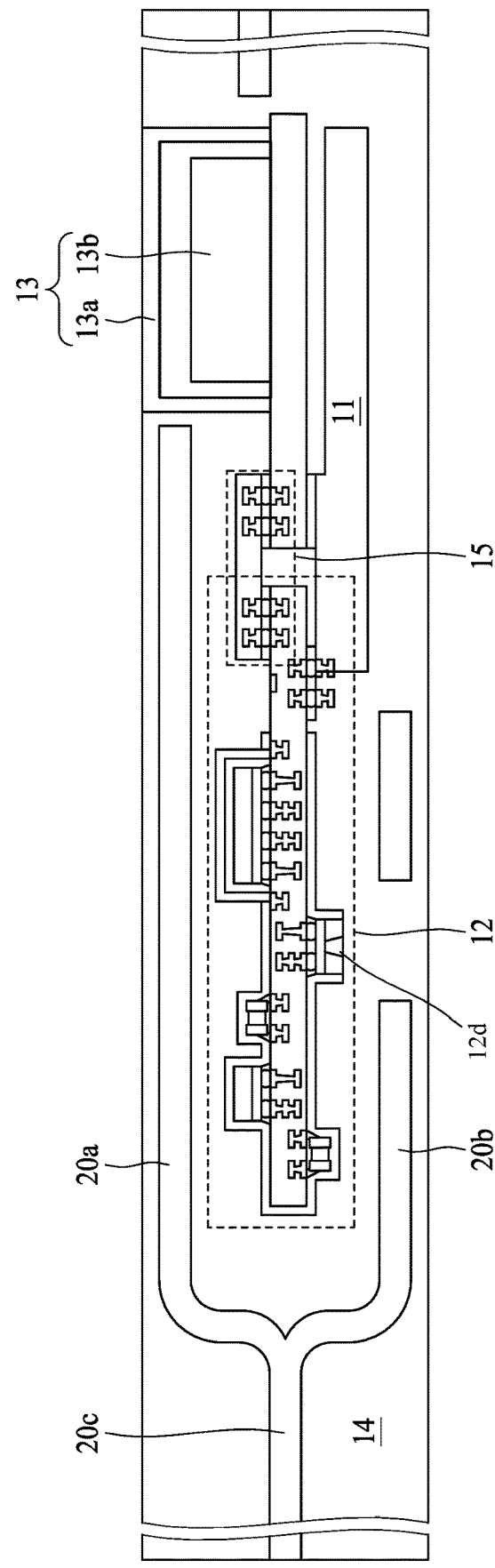
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 has reinforced structures 20a, 20b, and 20c, the power device 11, the electronic component 12, the display device 13, the encapsulation layer 14, and the connectors 15. The semiconductor device package 2 in FIG. 2 is similar to the semiconductor device package 1 in FIG. 1A, and the differences therebetween are described below.

The electronic component 12 is disposed at the substantially same elevation as the display device 13. The power device 11 is disposed at a different elevation from the electronic component 12 and the display device 13. The power device 11 is disposed below the electronic component 12 and the display device 13. In some embodiments, the relative positions of the power device 11, the electronic component 12, and the display device 13 may be set depending on design specifications.

The reinforced structures 20a and 20b provide protection for the power device 11, the electronic component 12, and the display device 13 from two sides. The reinforced structures 20a and 20b are in contact with each other. The reinforced structures 20a and 20b may have a curved shape as shown in FIG. 2. The reinforced structure 20c is disposed laterally with respect to the electronic component 12. The reinforced structure 20c is in contact with the reinforced structures 20a and 20b. In some embodiments, the reinforced structure 20c is disposed at the central axis of the encapsulation layer 14. In some embodiments, the reinforced structure 20c is disposed at portions of the encapsulation layer 14 devoid of components (such as the power device 11, the electronic component 12, and the display device 13) to provide support for the encapsulation layer 14. In some embodiments, the reinforced structure 20c can be eliminated.

Figure 3:
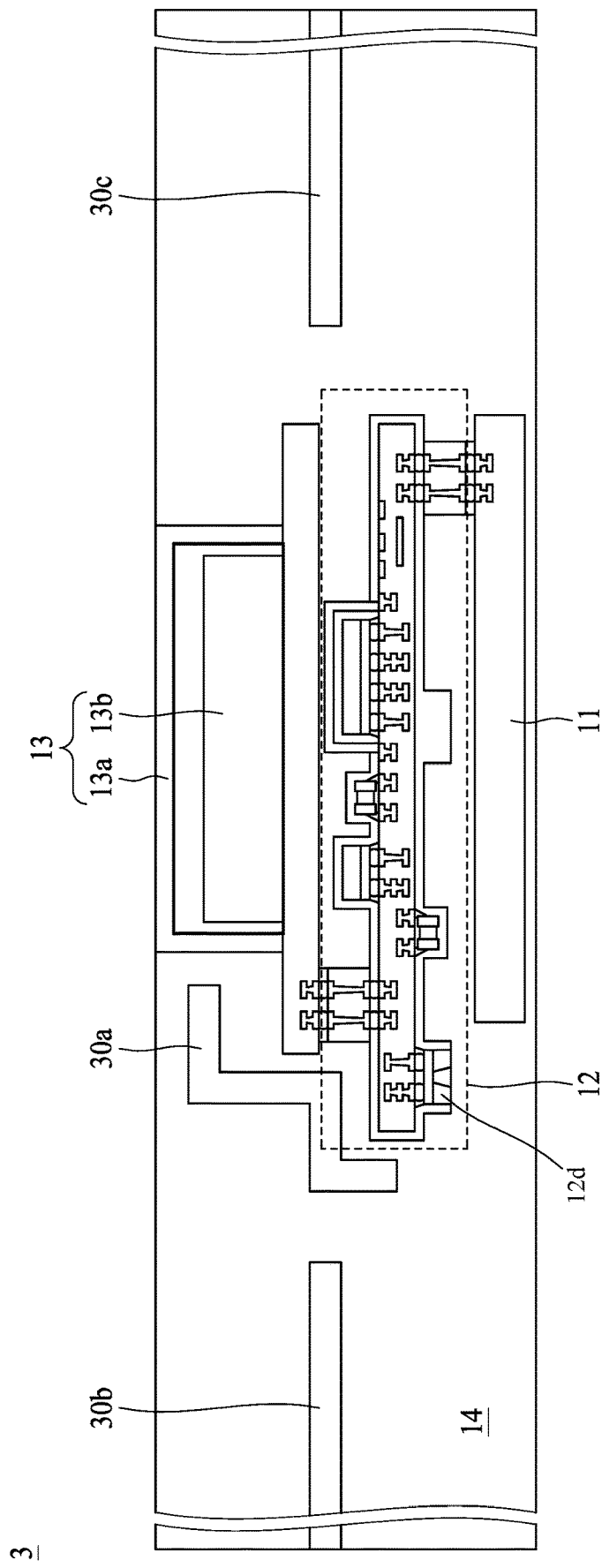
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 has reinforced structures 30a, 30b, and 30c, the power device 11, the electronic component 12, the display device 13, and the encapsulation layer 14. The semiconductor device package 3 in FIG. 3 is similar to the semiconductor device package 1 in FIG. 1A, and the differences therebetween are described below.

The electronic component 12 is disposed between the power device 11 and the display device 13. The sensor 12d of the electronic component 12 is not overlapped with the power device 11 and/or the display device 13. The power device 11, the electronic component 12, and the display device 13 are disposed at different elevations. In some embodiments, the electronic component 12 is disposed at the central axis of the encapsulation layer 14.

The reinforced structure 30a and the electronic component 12 are partially overlapped. In some embodiments, there may be a reinforced structure disposed adjacent to the electronic component 12 to protect the electronic component 12. By this way, the electronic component 12 can be protected by the power device 11, the display device 13, and the reinforced structure. In some embodiments, the reinforced structure 30a can be eliminated. In some embodiments, the reinforced structure 30b and/or the reinforced structure 30c is disposed at portions of the encapsulation layer 14 devoid of components (such as the power device 11, the electronic component 12, and the display device 13) to provide support for the encapsulation layer 14. In some embodiments, the reinforced structure 30b and/or the reinforced structure 30c can be eliminated.

FIG. 4A, FIG. 4B, FIG. 4C and FIG. 4D are cross-sectional views of an electronic component at various stages of fabrication, in accordance with some embodiments of the present disclosure. At least some of these figures have been simplified for a better understanding of the aspects of the present disclosure.

Figure 4A:
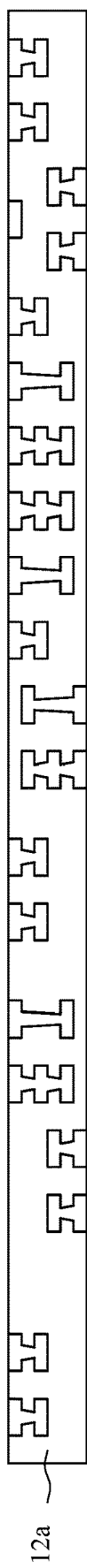
FIG. 4A illustrates one or more stages of a method of manufacturing an electronic component in accordance with some embodiments of the present disclosure.

Referring to FIG. 4A, a substrate 12a is provided. In some embodiments, the substrate 12a may be a flexible substrate. The substrate 12a may include an interconnection structure, such as an RDL or a grounding element.

Figure 4B:
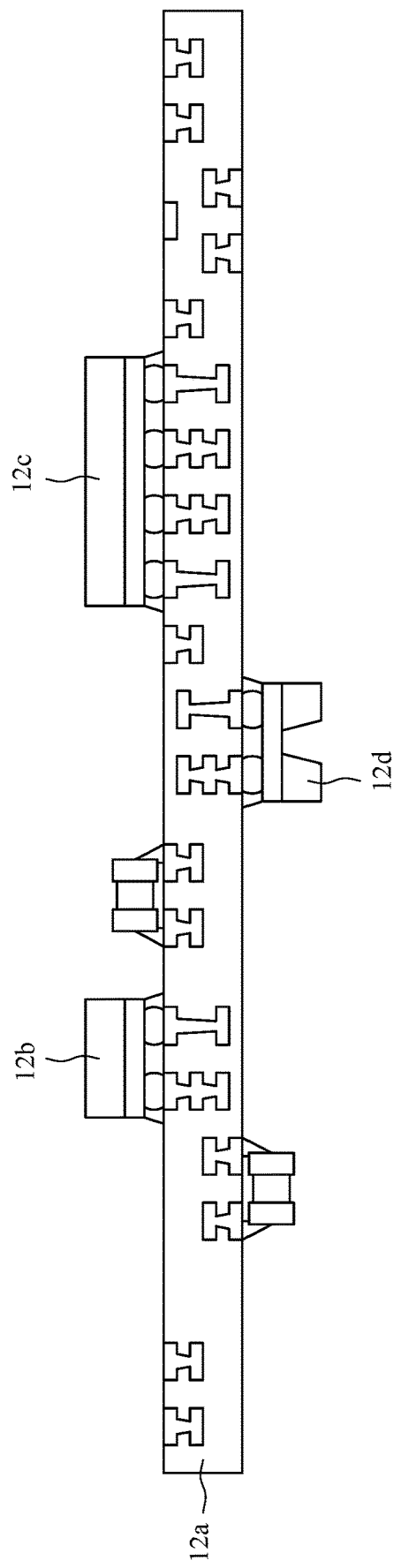
FIG. 4B illustrates one or more stages of a method of manufacturing an electronic component in accordance with some embodiments of the present disclosure.

Referring to FIG. 4B, electronic devices 12b and 12c (such as an RF device) and a sensor 12d (such as a MEMS sensor) are provided on the substrate 12a.

Figure 4C:
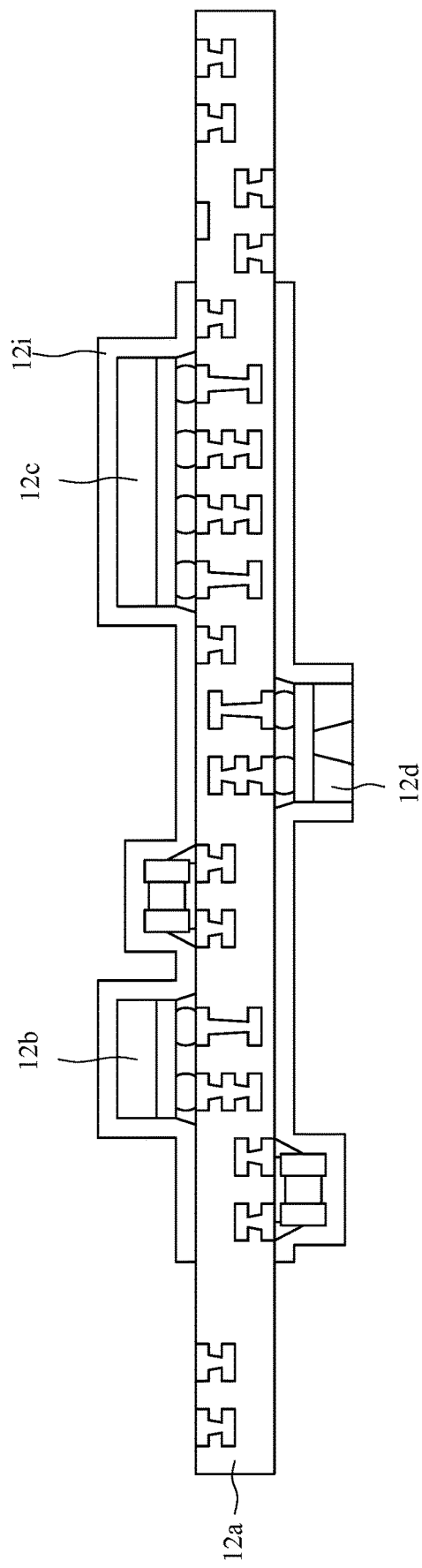
FIG. 4C illustrates one or more stages of a method of manufacturing an electronic component in accordance with some embodiments of the present disclosure.

Referring to FIG. 4C, an insulator 12i is disposed on the substrate 12a. In some embodiments, the insulator 12i may include a monomer, such as p-Xylene (para-xylene), Parylene N, Parylene C, and Parylene D. In some embodiments, the insulator 12i is conformally coated on the substrate 12a and the power device 12c. In some embodiments, a mask may be provided on the substrate 12a to cover some portions, and the insulator 12i is conformally coated the exposed portions of on the substrate 12a and the power device 12c. In some embodiments, the insulator 12 may be patterned through, for examples, plasma.

Figure 4D:
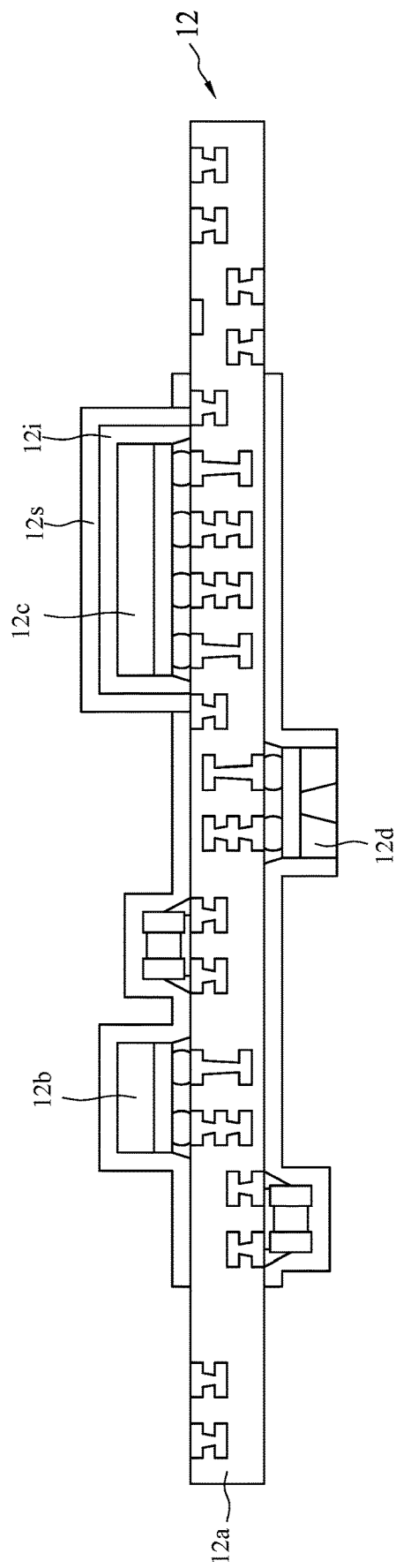
FIG. 4D illustrates one or more stages of a method of manufacturing an electronic component in accordance with some embodiments of the present disclosure.

Referring to FIG. 4D, a shield 12s is provided on the substrate 12a to cover the power device 12c. In some embodiments, the shield 12s is a conductive thin film, and may include, for example, aluminum (Al), Cu, chromium (Cr), tin (Sn), gold (Au), silver (Ag), Ni or stainless steel, or a mixture, an alloy, or other combination thereof. The product manufactured from the operations through FIGS. 4A to 4D is an electronic component 12.

FIG. 5A, FIG. 5B, FIG. 5C and FIG. 5D are cross-sectional views of a semiconductor device package at various stages of fabrication, in accordance with some embodiments of the present disclosure. At least some of these figures have been simplified for a better understanding of the aspects of the present disclosure.

Figure 5A:
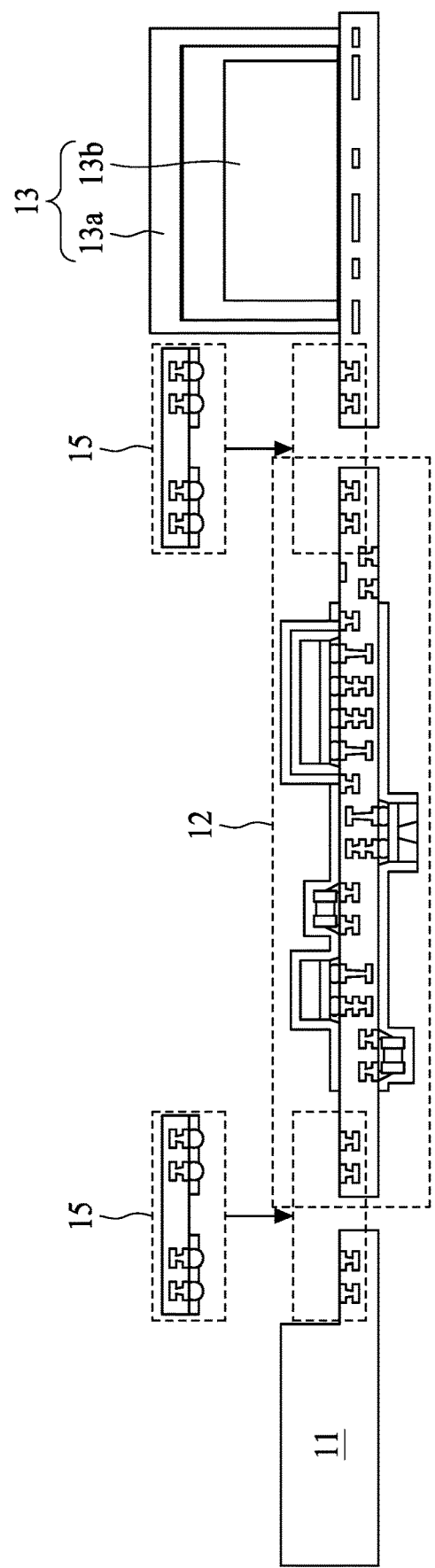
FIG. 5A illustrates one or more stages of a method of manufacturing a semiconductor device package in accordance with some embodiments of the present disclosure.

Referring to FIG. 5A, a power device 11, an electronic component 12 obtained from the operations through FIGS. 4A to 4D, and a display device 13 are electrically connected through connectors 15. In some embodiments, the connectors 15 may be replaced by conductive contactors on the power device 11, the electronic component 12, and the display device 13.

Figure 5B:
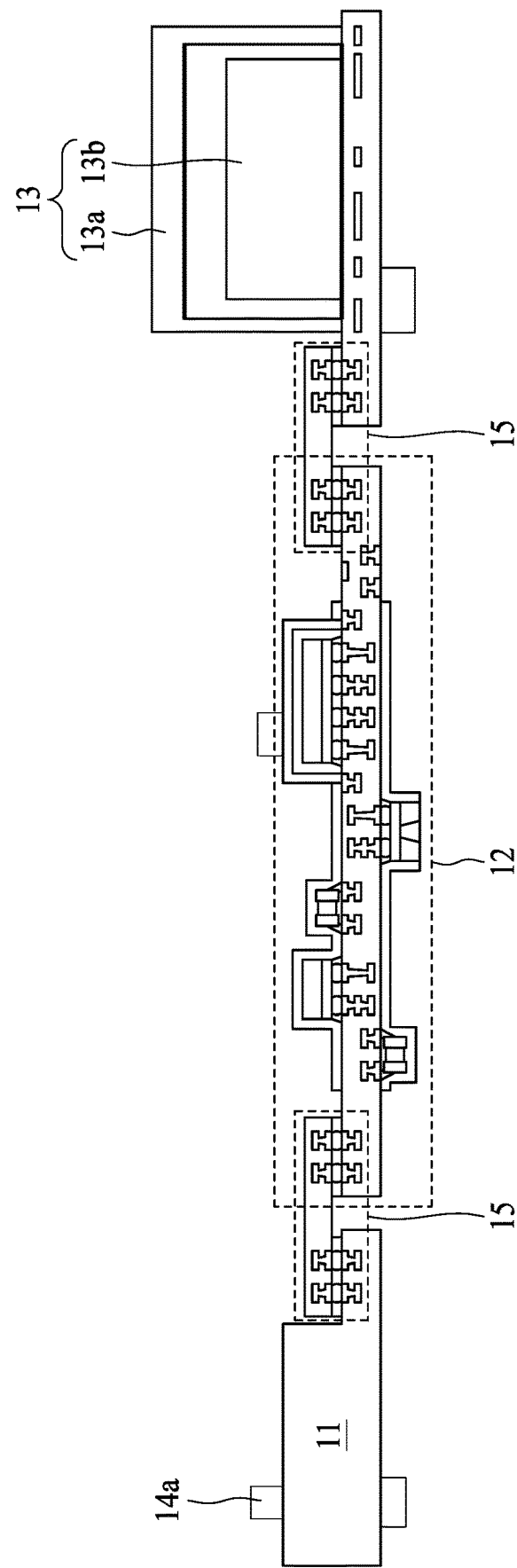
FIG. 5B illustrates one or more stages of a method of manufacturing a semiconductor device package in accordance with some embodiments of the present disclosure.

Referring to FIG. 5B, spacers 14a are provided on the power device 11, the electronic component 12, and the display device 13 to provide buffers for the disposing of the reinforced structures in the following operations.

Figure 5C:
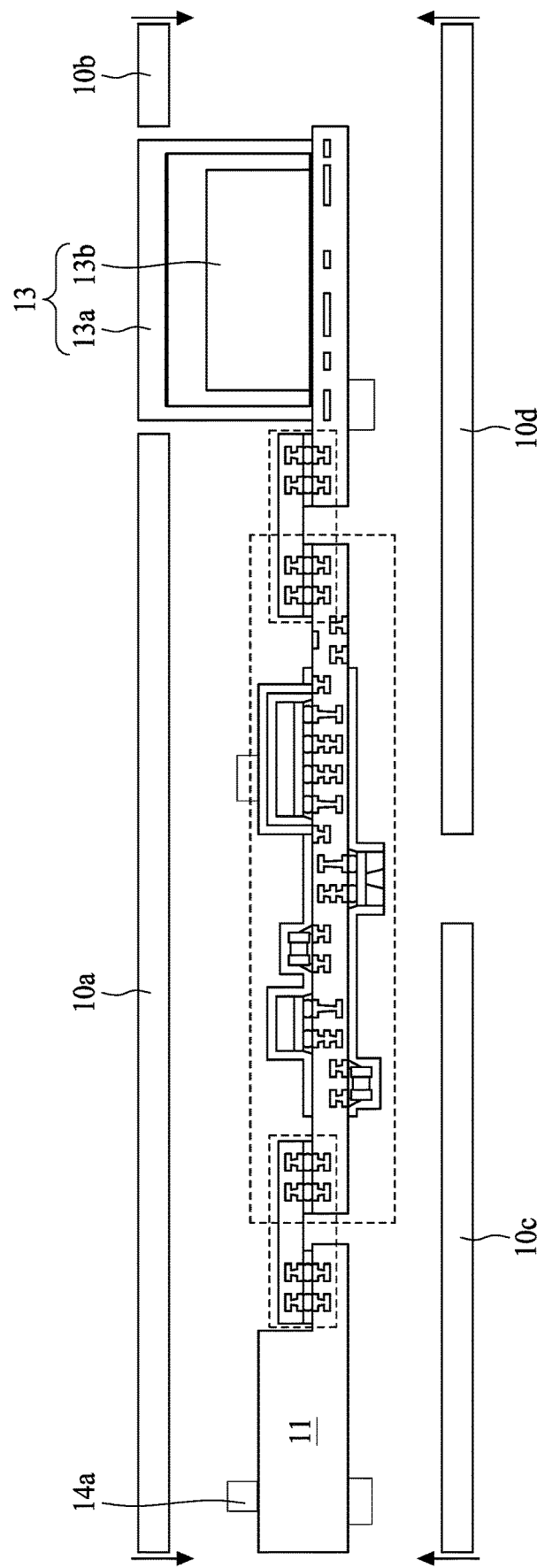
FIG. 5C illustrates one or more stages of a method of manufacturing a semiconductor device package in accordance with some embodiments of the present disclosure.

Referring to FIG. 5C, reinforced structures 10a, 10b, 10c, and 10d are disposed on the spacers 14a to provide protections for the power device 11, the electronic component 12, and the display device 13.

Figure 5D:
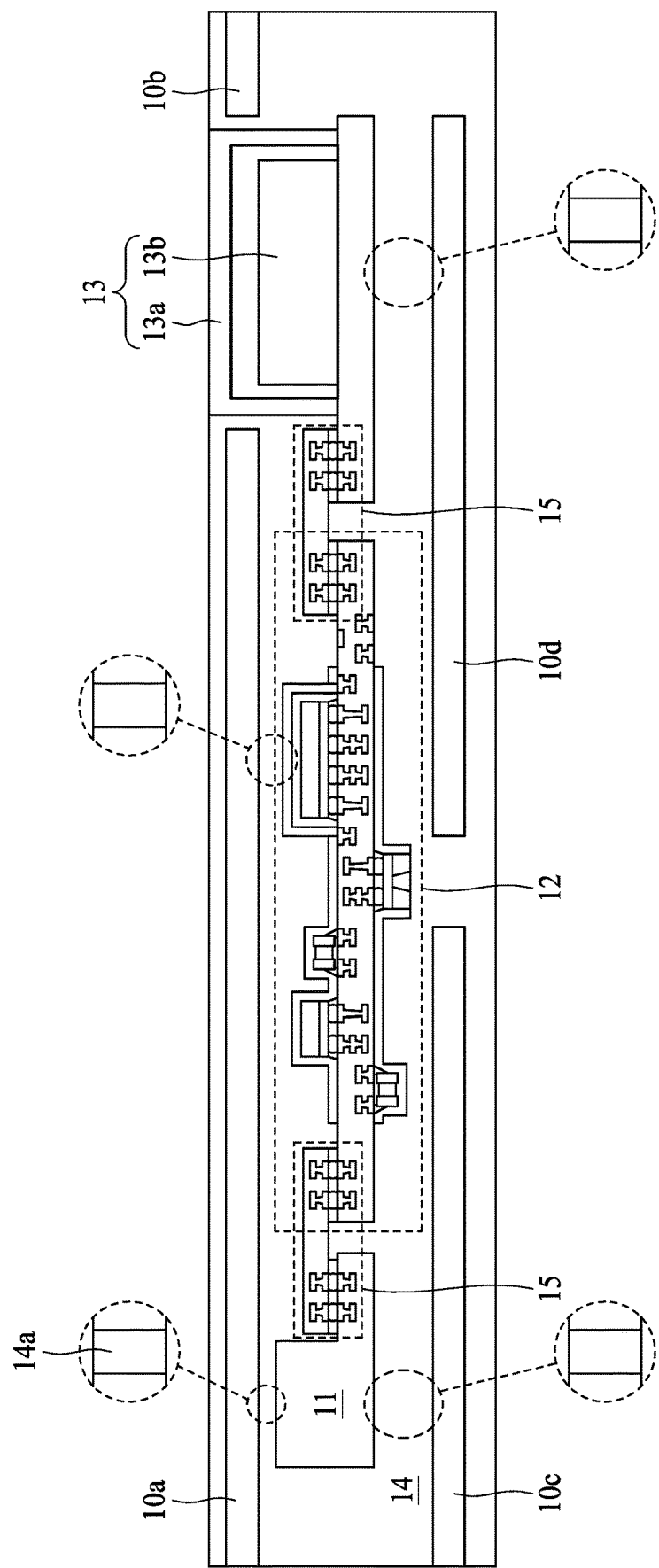
FIG. 5D illustrates one or more stages of a method of manufacturing a semiconductor device package in accordance with some embodiments of the present disclosure.

Referring to FIG. 5D, an encapsulation layer 14 is disposed to surround the power device 11, the electronic component 12, and the display device 13. The encapsulation layer 14 is also disposed to surround the reinforced structures 10a, 10b, and 10d. In some embodiments, the encapsulation layer 14 may be formed by a molding technique, such as transfer molding or compression molding.

Figure 6:
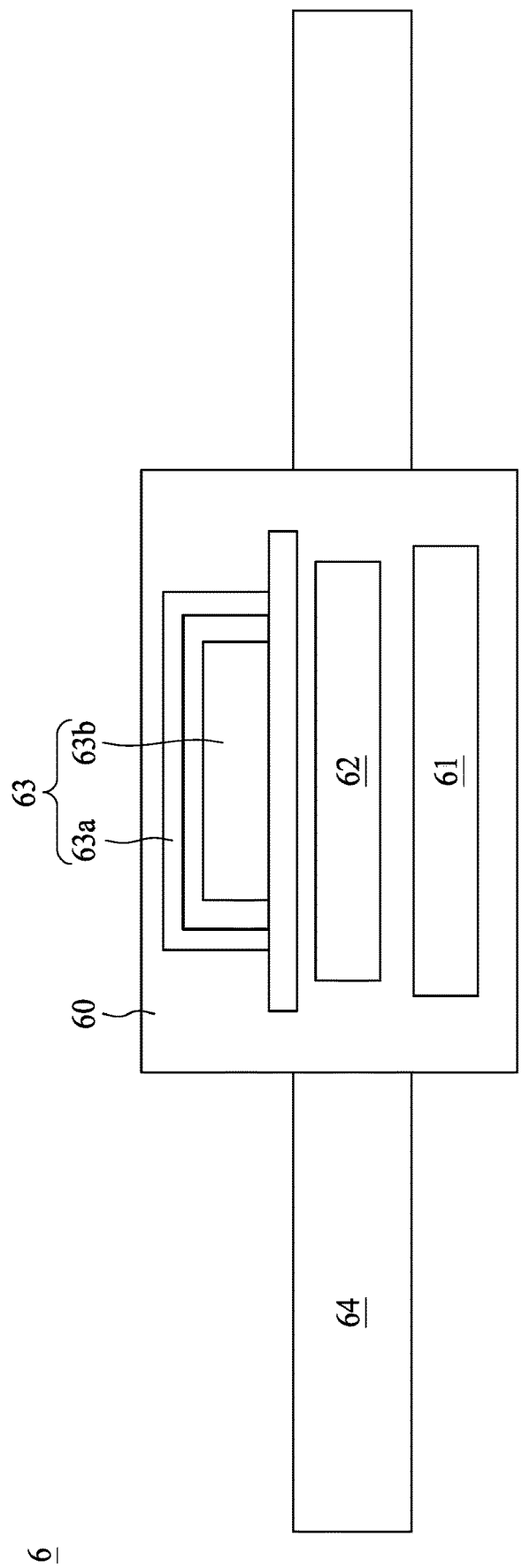
FIG. 6 illustrates a comparative embodiment of a semiconductor device package of the present disclosure.

FIG. 6 illustrates a cross-sectional view of a semiconductor device package 6 of a comparative embodiment. The semiconductor device package 6 includes a housing and a band 64 attached to the housing 60. The housing 60 accommodates a power device 61, an electronic component 62, and a display device 63. The power device 61, the electronic component 62, and the display device 63 are enclosed in the housing 60. The power device 61, the electronic component 62, and the display device 63 are stacked in the housing 60. The display device 63 includes a housing 63a and a light-emitting device 63b within the housing 63a. There are at least two housings (the housing 63a and the housing 60) outside the light-emitting device 63b.

If extra function(s) is specified to be added in the watch (such as the semiconductor device package 6), more components should be introduced into the housing (such as the housing 60). Size and weight of the housing may inevitably increase, which may adversely affect user's experience.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm within 5 μm, within 1 μm or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. An electronic device, comprising:
a circuit;
a first reinforced structure disposed adjacent to the circuit;
a sensor connected to the circuit;
a second reinforced structure, wherein the circuit is disposed between the first reinforced structure and the second reinforced structure, and wherein the sensor is exposed from the second reinforced structure; and
an encapsulation layer covering the first reinforced structure and the second reinforced structure; the encapsulation layer has a curved surface.

2. The electronic device of claim 1, wherein the encapsulation layer covers a power device.

3. The electronic device of claim 2, wherein the encapsulation layer is disposed around the first reinforced structure and the second reinforced structure.

4. The electronic device of claim 1, further comprising:
a device disposed over the circuit, and wherein the device is at least partially disposed in an opening defined by the first reinforced structure.

5. The electronic device of claim 1, further comprising:
an electronic component, wherein the circuit is disposed between the electronic component and the sensor.

6. The electronic device of claim 1, wherein the circuit comprises:
a first portion;
a second portion separated from the first portion; and
a connector connecting the first portion with the second portion, wherein a thickness of the connector is less than a thickness of the first portion or a thickness of the second portion.

7. The electronic device of claim 6, further comprising:
an electronic component supported by the first portion or the second portion.

8. The electronic device of claim 6, wherein the connector covers a gap defined between the first portion and the second portion.

9. The electronic device of claim 6, wherein the connector comprises a circuit board.

10. The electronic device of claim 1, further comprising:
an electronic component electrically connected with the circuit, and disposed between the circuit and the second reinforced structure.

11. An electronic device, comprising:
an electronic component;
a first reinforced structure disposed over the electronic component, wherein the first reinforced structure has a curved shape;
a power device, wherein at least a part of the first reinforced structure is overlapping with the power device, and wherein at least a part of the electronic component is disposed between the first reinforced structure and the power device; and
a second reinforced structure, wherein the power device is disposed between the first reinforced structure and the second reinforced structure.

12. The electronic device of claim 11, wherein at least a part of the electronic component is overlapping with the first reinforced structure in a top view.

13. The electronic device of claim 11, wherein the electronic device and the first reinforced structure have a substantially same radius of curvature.

14. An electronic device, comprising:
a flexible circuit structure;
a protective structure encapsulating the flexible circuit structure, wherein the protective structure has a curved surface; and
a sensor electrically connected to the flexible circuit structure and exposed by the protective structure.

15. The electronic device of claim 14, wherein the protective structure comprises a flexible material.

* * * * *